United States Patent [19]
Ransom

[11] Patent Number: 4,912,284
[45] Date of Patent: Mar. 27, 1990

[54] ELECTRICAL CIRCUITS

[75] Inventor: Christopher J. Ransom, Chippenham, United Kingdom

[73] Assignee: U.S. Philips Corporation, New York, N.Y.

[21] Appl. No.: 233,924

[22] Filed: Aug. 16, 1988

Related U.S. Application Data

[60] Continuation of Ser. No. 119,305, Nov. 6, 1987, abandoned, which is a continuation of Ser. No. 940,238, Dec. 9, 1986, abandoned, which is a continuation of Ser. No. 860,694, May 2, 1986, abandoned, which is a continuation of Ser. No. 740,681, Jun. 3, 1985, abandoned, which is a division of Ser. No. 733,853, May 13, 1985, which is a continuation of Ser. No. 483,831, Nov. 3, 1982, abandoned.

[30] Foreign Application Priority Data

Nov. 4, 1981 [GB] United Kingdom ............... 8133262
Sep. 29, 1982 [GB] United Kingdom ............... 8227748

[51] Int. Cl.⁴ ........................................... H05K 1/00
[52] U.S. Cl. ..................................... 174/258; 420/40
[58] Field of Search .............. 420/40, 428; 174/68.5

[56] References Cited

U.S. PATENT DOCUMENTS

| | | | |
|---|---|---|---|
| 2,974,284 | 3/1961 | Parker | 174/68.5 X |
| 3,027,252 | 3/1962 | McGurty et al. | 420/40 |
| 3,165,672 | 1/1965 | Gellert | 174/68.5 X |
| 3,202,591 | 8/1965 | Curran | 174/68.5 X |
| 3,268,778 | 8/1966 | Worsham | 174/68.5 X |
| 4,230,489 | 10/1980 | Antill | 420/40 |
| 4,385,934 | 5/1983 | McGurty | 420/40 |
| 4,410,927 | 10/1983 | Butt | 361/403 |
| 4,434,544 | 3/1984 | Dohya et al. | 174/68.5 X |
| 4,483,751 | 11/1984 | Murayama et al. | 174/68.5 X |
| 4,491,622 | 1/1985 | Butt | 174/68.5 ZR |
| 4,495,378 | 1/1985 | Dotzer | 174/68.5 |

FOREIGN PATENT DOCUMENTS 1136753 12/1968 United Kingdom ........... 361/414 X Primary Examiner—Gerald P. Tolin
Attorney, Agent, or Firm—Norman N. Spain

[57] ABSTRACT

A hybrid or printed circuit is formed on a substrate (1) which comprises an iron-chromium-aluminum alloy which may also contain Yttrium and which forms a stable inert strongly adhering ceramic layer (5,6) on its exposed surfaces when heated in an oxidizing atmosphere in order to produce a hybrid circuit a dielectric paste is printed on the ceramic surface (5) of the alloy to form a platform (9). Conductors (10,11) are then printed on the dielectric platform (9) and fired. One or more component(s) (8) is/are then soldered to the conductors.

2 Claims, 1 Drawing Sheet

ELECTRICAL CIRCUITS

This is a continuation of application Ser. No. 119,305 filed 11/06/87 now abandoned, which is a continuation of Ser. No. 940,238 filed 12/09/86 now abandoned, which is a continuation of Ser. No. 860,694 filed 5/02/86 now abandoned, which is a continuation of Ser. No. 740,681 filed 6/03/85 now abandoned, which is a division of Ser. No. 733,853 filed 5/13/85, which is a continuation of Ser. No. 483,831 filed 11/03/82, now abandoned.

BACKGROUND OF THE INVENTION

The invention relates to an electrical circuit comprising electrical conductors formed on a surface of a substrate and to a method of manufacturing such electrical circuits.

Hybrid circuits typically use a substrate of alumina onto which various pastes are printed and fired to form conductors, resistors and insulating layers. The disadvantage of the alumina substrate is that it is brittle and becomes difficult to handle in sizes above about 4 inches square.

In printed circuit board technology there is a trend towards using "lead-less" components as these are directly soldered to the conductor tracks and do not require holes to be drilled in the boards into which component leads are inserted. The cost of drilling of printed circuit boards is a significant proportion of the total cost of the assembly. An article by P. R. Jones entitlted "Leadless carriers, components increase board density by 6:1" which was published in the issue of Electronics International dated 25th Aug. 1981 at pages 137 to 140 describes such a technique and is hereby incorporated by reference. The substrates used in the equipment described in this article were the usual epoxy-glass or polyimide-glass substrates which have significantly different temperature co-efficients of expansion from that of the components which are soldered to the printed tracks. The author of this article states that the differences in temperature co-efficients of expansion of the substrate and the ceramic leadless components did not effect the reliability of the circuits. However other articles suggest that this effect may cause broken joints between the components and the conductor tracks when the circuit is temperature cycled.

It has been proposed to use various metal alloys such as Invar or the Alloy 42 nickel-iron material as a substrate for printed circuit boards. These materials have a temperature coefficient of expansion which is more nearly compatible with that of the leadless components. Such substrates have been described in articles in the issues Electronics International dated 13th Jan. 1981 (pages 48, 53 and 54), 10th Feb. 1981 (pages 44 to 46) and 16th June 1981 (page 46). In all these cases the metal alloys are used as a backing material to give structural strength and are bonded to epoxy-glass layers on which the circuit is printed.

SUMMARY OF THE INVENTION

It is an object of the invention to provide a substrate for electrical circuits in the form of hybrid circuits which is less brittle than the currently used alumina substrates. It is a further object of the invention to provide a substrate for electrical circuits in the form of printed circuit boards which is suitable for mounting leadless components and does not require the bonding of epoxy layers to a core.

The invention provides an electrical circuit as described in the opening paragraph characterized in that the substrate comprises an alloy which when heated in an oxidizing atmosphere forms a ceramic layer on its exposed surfaces. Since hybrid circuits are normally formed on a ceramic substrate the conductor, resistor and dielectric pastes developed for standard hybrid circuits are compatible with the ceramic layer on the exposed surfaces of the alloy.

The alloy may be an iron-chromium-aluminum alloy. Such alloys when heated in an oxidising atmosphere form an alumina layer on their exposed surfaces.

The alloy may additionally comprise Yttrium and Silicon. The addition of these elements is thought to assist in the formation and bonding of the alumina layer to the surface of the alloy.

Alternatively, the alloy may be of the type M-Cr-Al-Y where M represents iron, nickel or cobalt.

Instead of forming the substrate totally of the alloy, the alloy may be applied as a surface coating on a substrate of a different constitution.

The invention further provides a method of producing an electrical circuit comprising the steps of heating such an alloy in an oxidizing atmosphere to form a stable, inert, strongly adhering ceramic layer on its ceramic layers, printing and firing one or more layers of dielectric paste over at least a part or parts of one of the exposed surfaces bound to the alloy, printing conductor tracks and/or resistors on the dielectric, and soldering components to the conductor tracks.

The method may further include the steps of printing solder onto selected locations of the circuit, mounting components on the substrate and reflow soldering the components to the substrate. The components may be attached to the substrate by vapour phase reflow soldering. The electrical circuit may be in the form of a hybrid circuit and a plurality of hybrid circuits may be formed on a single substrate which is then divided to form individual circuits.

The substrate may be formed into a desired shape by conventional metal working techniques either before or after the hybrid circuit(s) has/have been formed.

DESCRIPTION OF THE PREFERRED EMBODIMENTS

Figure 1:
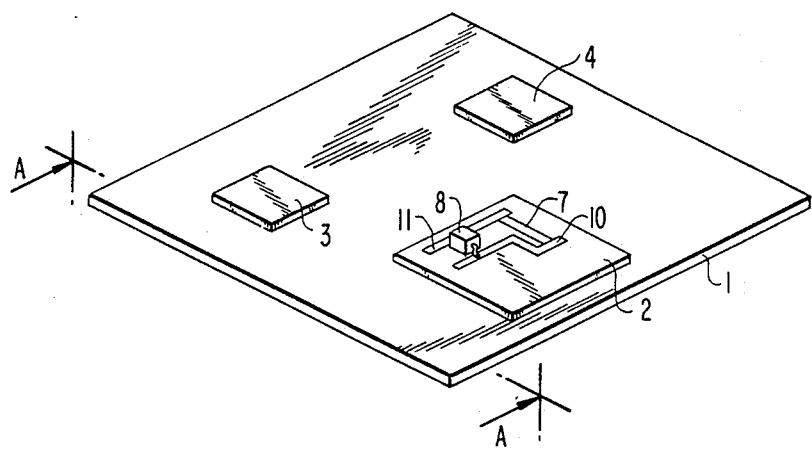
FIG. 1 is a perspective view of a substrate according to the invention on which a plurality of thick film circuits have been formed.

An embodiment of the invention will now be described, by way of example, with reference to the accompanying drawing, in which FIG. 1 shows a substrate 1 on which thick film circuits 2,3 and 4 are formed. The substrate 1 is formed from an alloy which has the property of forming a stable, tenacious ceramic layer on its exposed surfaces under oxidizing conditions. A suitable alloy is an iron-chromium-aluminium alloy having an yttrium addition such as the series offered by Resistalloy Limited under the trademark FECRALLOY (FECRALLOY is a trademark of the United Kingdom Atomic Energy Authority). A particular alloy of this series (FECRALLOY A) has as a typical composition of Carbon 0.03%, Silicon 0.3%, Chromium 15.8%, Aluminum 4.8%, Yttrium 0.3% and the balance Iron.

Figure 2:
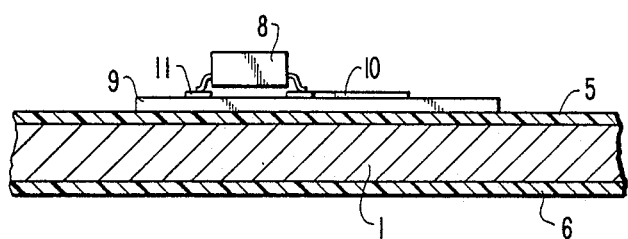
FIG. 2 is a partial cross-sectional view on line A—A of FIG. 1.

When the substrate 1 is formed from FECRALLOY A the alloy is first heated to a temperature of 1100° C. in an oxidizing atmosphere. This causes a layer of alumina to be formed at the exposed surfaces of the substrate. The cross-sectional view in FIG. 2 shows the layers 5 and 6 of alumina formed at the surfaces of the substrate 1. It is recommended that the substrate should be held at the temperature of 1100° C. for a period of two hours when it is to be used at temperatures below 1100° C. as it will be when used as a substrate for electrical circuits.

When the alumina layer 5 has been formed on the substrate 1 a dielectric paste is printed onto the layer 5 by a conventional screen printing process and then fired at a temperature of 850° C. for a period of 10 minutes. The total process time, that is including the time to raise the temperature to 850° C. and to cool the assembly to ambient temperature after the 10 minute firing period, is approximately 60 minutes. This step may be repeated to build up a platform 9 of the desired thickness. Subsequently conductor tracks 10,11 and resistor 7 are printed and fired conventionally. A number of manufacturers offer dielectric, resistor and conductor pastes and inks for producing hybrid circuits which may be successfully used on this substrate. An example is the system offered by Electro-Science Laboratories Inc of 2211 Sherman Avenue, Pennsauken, N.J. 08110, USA, the dielectric being type 4903, resistors 3900 series and the conductors palladium-silver 9669. Solder is then screen printed onto the circuit and components 8 attached and reflow soldered to the conductors. Vapour phase soldering techniques are suitable for performing this operation. The FECRALLOY substrate may then be formed into a desired shape to form a structural part of the equipment of which the circuit forms part provided that care is taken not to deform the substrate in the area of the dielectric platform 9. For example the substrate 1 could be formed to provide the base of a telephone instrument onto which a plastics cover is mounted. This enables the use of separately mounted circuit boards to be reduced or eliminated. Alternatively, the substrate may be formed into a desired shape before the printing and firing of the dielectric, conductor and resistor pastes.

FECRALLOY A has the important properties for the use as a substrate for electrical circuits of forming a stable, inert, strongly adherent ceramic (alumina) coating when exposed to even small quantities of oxygen at high temperatures (between 1000° C. and 1200° C.). The processing conditions necessary to form this coating are not critical. Once formed, this coating can withstand repeated exposure (1,000's of hours) to high temperatures (1000° C.) in oxidizing and reducing atmospheres, without degrading the properties of the alumina coating. Consequently, it is capable of supporting multilayered thick-film structures requiring multiple firings at temperatures up to 950° C. The final properties of these films do not differ significantly from the high qualities these same films would exhibit if deposited on ceramic substrates in the normal way i.e. conductors can be multilayered, readily soldered with conventional solders and wire bonded; resistors can be made with sheet resistivities in the range 10 ohm/sq. to 1 megohm/sq; and insulating layers can be formed between different conductor layers, providing $10^{13}$ ohm resistance at 400 volts.

It is possible to form this alumina coating in an even thickness all over the surface of a preformed, shaped sheet. This is especially important in providing a good coating onto shapes (e.g. small holes, corners, edges) that are very difficult, or impossible to achieve by other methods and materials.

A multiplicity of shaped Fecralloy substrates may be formed on a single sheet of FECRALLOY so that the costs of handling individual substrates is reduced. Such individual substrates can be separated from the array using conventional metal working techniques e.g. blanking, guillotining, sawing etc.-without damage to the thick film coatings on them, but it will be desirable to seal the exposed, unoxidised FECRALLOY which results from the cutting operation to prevent the formation of rust on these edges.

FECRALLOY, coated with multilayered thick films may be used as a replacement for alumina ($Al_2O_3$) as the substrate for thick film circuits especially where irregularly shaped substrates are required or where larger sized substrates are required when alumina becomes expensive and fragile.

It may also be used as a replacement for conventional printed circuit board materials to make printed circuit boards with multilayer interconnection tracks especially for interconnecting surface mounting components. In this case an important property of FECRALLOY is that its temperature coefficient of expansion ($11 \times 10^{-6°}$ C.) is much closer to that of the surface mounted components, than is the temperature coefficient of expansion of epoxy board ($50 \times 10^{-6°}$ C.). Thus the assembled components and boards can withstand temperature cycling over a wider temperature range, and withstand more cycles between extreme temperatures, when FECRALLOY is used for the substrate material. When fabricating printed circuit boards the dielectric paste may be printed over the whole of one or more surfaces of the substrate.

While a particular commercially available alloy, FECRALLOY A has been selected as being the most convenient to use at the date of this application other alloys which have the property of forming a ceramic layer on their exposed surfaces when heated in an oxidizing atmosphere may be used. It is, of course, necessary in selecting the alloy to form the substrate to ensure that it will stand up to the required processing temperatures, e.g. up to about 1000° C. for firing the dielectric, conductor and resistor pastes, and to take into account the matching of the temperature co-efficients of expansion of the alloy and the components which are to be mounted on the substrate.

A range of Iron-Chromium-Aluminum alloys which react with oxygen to form a protective layer of relatively pure alumina is disclosed in Volume 3 of the Ninth Edition of the Metals Handbook published by the American Society for Metals. Their use as electrical resistance alloys is discussed at page 647 of this publication. A range of such alloys is listed in Table 5 and it is also stated that at about 1200° C. the oxide formed on these alloys consists of approximately 94.5% $Al_2O_3$, 3.5% $Cr_2O_3$ and 2% $Fe_2O_3$ and that this dielectric skin has extremely high dielectric strength.

Iron-Chromium-Aluminum-Yttrium alloys are also disclosed in U.S. Pat. No. 3027252 and UK Patent Specifications Nos. 1045993, 1598827 and 1598828. UK Patent Application No. 2019886A discloses an Iron-Chromium-Aluminum-Yttrium alloy containing additionally certain proportions of Silicon. FECRALLOY A has proportions of Iron, Chromium, Aluminum, Yttrium and Silicon within the ranges disclosed in that patent application.

UK Patent Specification No. 1261261 discloses a method of coating nickel-base and cobalt-base superalloys with an alloy consisting of 20-50% chromium, 10-20% Aluminum, 0.03-2% Yttrium or a rare earth element and the balance Iron. Thus the Yttrium content of the alloys may be replaced by a rare earth element. UK Patent Specifications Nos. 1261262 and 1439628 also disclose methods of coating nickel and cobalt base superalloys. No. 1439628 discusses the use of coating alloys consisting of Chromium, Aluminum, Yttrium, and Nickel, Cobalt, or Iron.

All these alloys or coatings will produce a ceramic layer on their exposed surfaces under oxidising conditions and are capable of withstanding the temperatures at which the conventional pastes and inks for forming hybrid circuits are fired.

I claim:

1. An electrical circuit comprising electrical conductors formed on an electrically insulating surface of a substrate characterized in that the substrate comprises an alloy of iron, chromium, aluminum and yttrium which, when heated in an oxidizing atmosphere, forms electrically insulating ceramic layers on its exposed surfaces, and an electrically insulating ceramic layer formed by heating said alloy in an oxidizing atmosphere, and that the electrical conductors are formed of an electrically conductive material other than said alloy.

2. A circuit as claimed in claim 1 in which the alloy additionally comprises Silicon.

* * * * *